United States Patent [19]

Murakoshi et al.

[11] Patent Number: 4,767,926
[45] Date of Patent: Aug. 30, 1988

[54] ELECTRON BEAM METROLOGY SYSTEM

[75] Inventors: Hisaya Murakoshi, Hachioji; Mikio Ichihashi, Kodaira; Kenichi Yamamoto, Koganei, all of Japan

[73] Assignee: Hitachi, Ltd., Tokyo, Japan

[21] Appl. No.: 911,791

[22] Filed: Sep. 26, 1986

[30] Foreign Application Priority Data

Sep. 30, 1985 [JP] Japan .................. 60-214715

[51] Int. Cl.[4] .............. H01J 37/22; H01J 37/28
[52] U.S. Cl. ..................... 250/310; 250/397
[58] Field of Search .............. 250/306, 307, 310, 311, 250/397, 399, 492.2, 492.3, 491.1; 324/71.3, 71.5

[56] References Cited

U.S. PATENT DOCUMENTS 3,329,813 7/1967 Hashimoto ............... 250/310
4,567,364 1/1986 Kuno et al. ............... 250/307
4,600,839 7/1986 Ichihashi et al. .......... 250/310

FOREIGN PATENT DOCUMENTS 0051460 3/1984 Japan ..................... 250/310
0112217 6/1984 Japan .

Primary Examiner—Bruce C. Anderson
Assistant Examiner—Paul A. Guss
Attorney, Agent, or Firm—Antonelli, Terry & Wands

[57] ABSTRACT

Disclosed is an electron beam metrology system for measuring the width of a pattern on a specimen by scanning the specimen with a deflected electron beam, detecting a pattern image signal provided by secondary electrons emitted from the specimen, and measuring the pattern width on the specimen on the basis of the pattern detection signal. The system comprises a signal detecting device including at least one set of two detectors disposed toward the scanning direction of the electron beam in a relation symmetrical with respect to the optical axis of the electron beam for detecting pattern image signals independently of each other, a device for recognizing surface topography of the pattern using an output signal of the signal detecting device, and a device for measuring the pattern width while discriminating as to whether the pattern is a raised-profile pattern or a hollow-profile pattern.

2 Claims, 7 Drawing Sheets

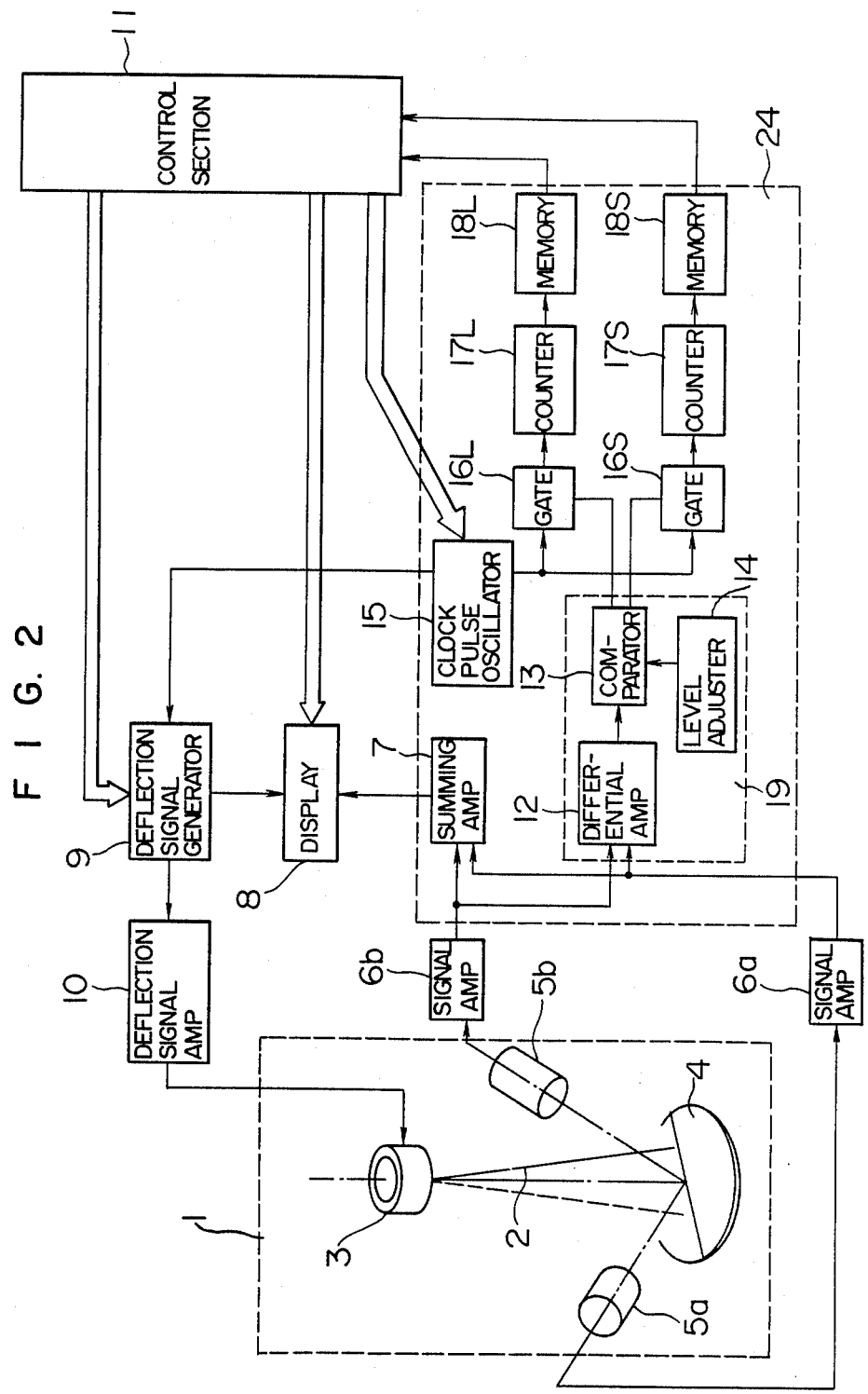

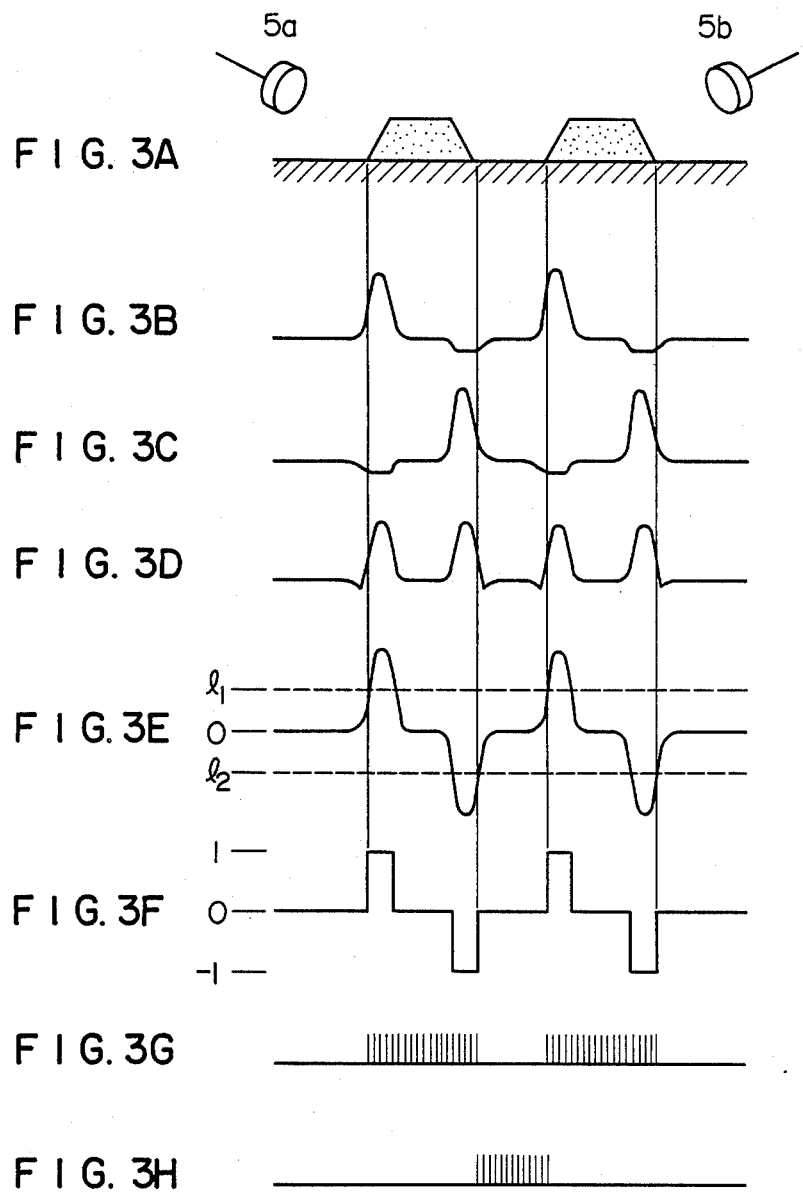

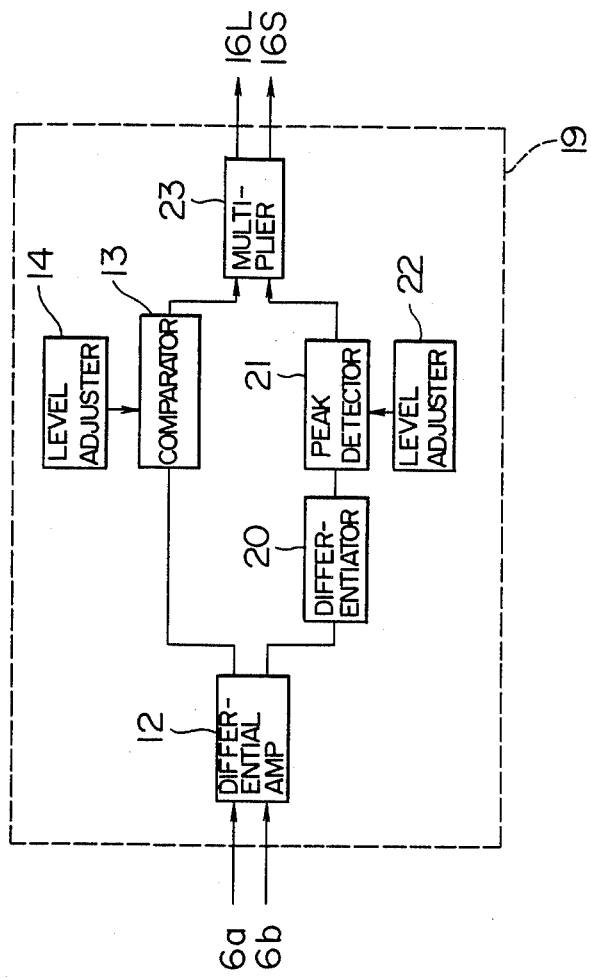

F I G. 5A 
F I G. 5B 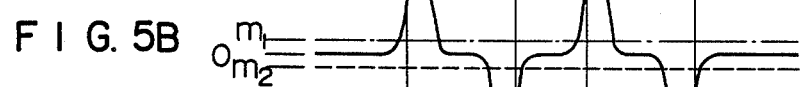
F I G. 5C 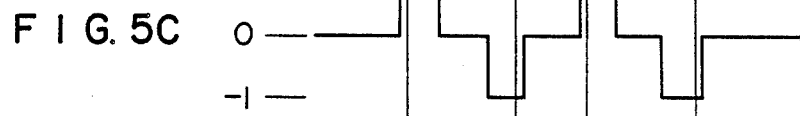
F I G. 5D 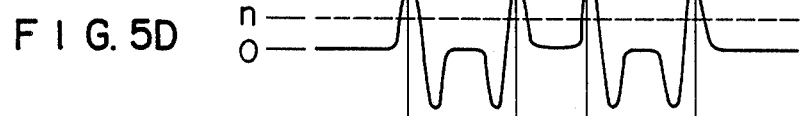
F I G. 5E 
F I G. 5F 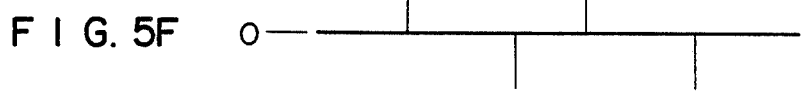

F I G. 6
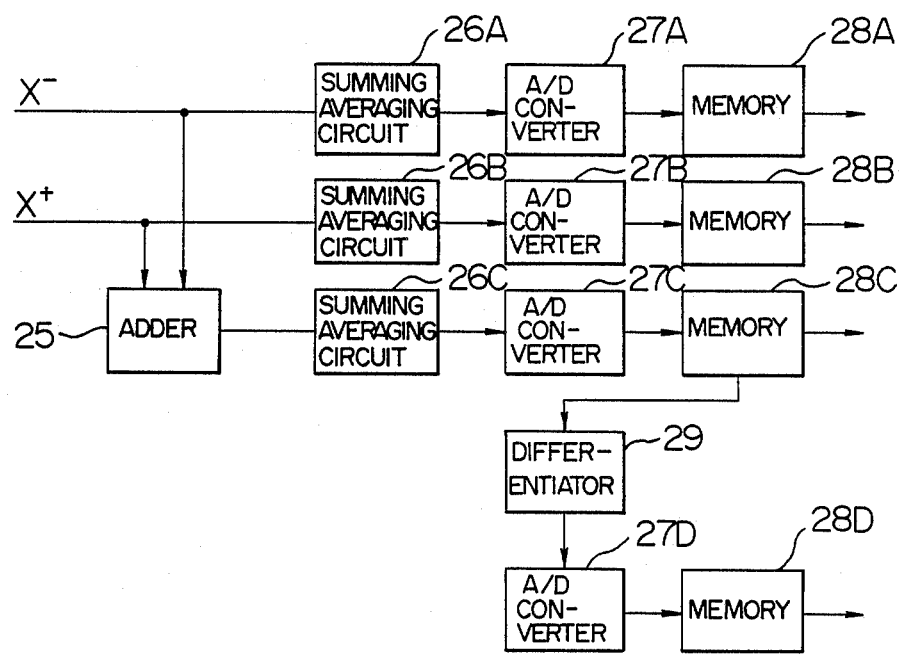

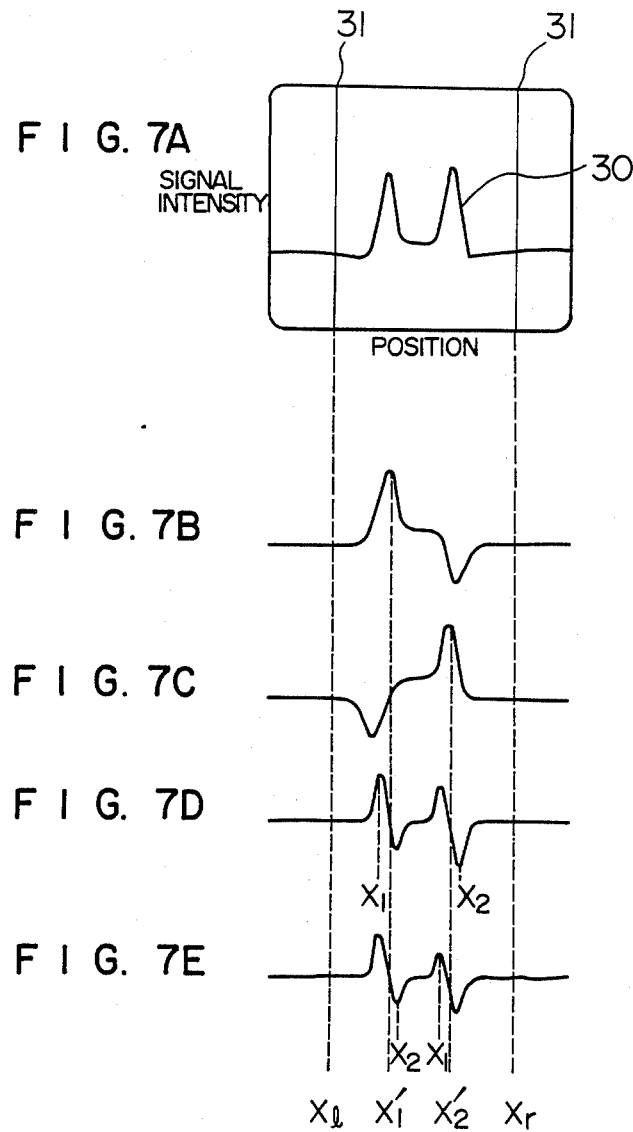

ELECTRON BEAM METROLOGY SYSTEM

BACKGROUND OF THE INVENTION

This invention relates to an electron beam metrology system for measuring a pattern width on a specimen by scanning with an electron beam, and more particularly to a system of the kind described above which has the function of judging the surface profile of a pattern for acquiring information of surface topography of the pattern.

To meet the recent tendency toward high integration of semiconductor circuits and resultant miniaturization of the width of patterns in circuit elements, there is a growing demand for development of a metrology system which replaces conventional optical metrology systems and measures the pattern width by scanning with an electron beam. Especially, for the purpose of development of a new process, it is necessary to measure and evaluate the width distribution of the same patterns on the entire surface of a specimen in the form of a wafer, and the number of patterns to be measured is very large. Manual measurement is unfit for satisfying the above requirement in view of the length of time required for measurement as well as the limited ability, and a system capable of automatic measurement of many patterns within a short period of time is indispensably required. From the aspect of surface profile, patterns to be measured are broadly classified into a line pattern having a raised profile, a space pattern having a hollow profile, and a line-and-space pattern formed of an alternation of a line pattern and a space pattern.

Figs. 1A and 1B are sectional views of practical examples of a line pattern and a space pattern provided by resist patterns 101 formed on silicon nitride films 100 respectively, and signal waveforms appearing as a result of one-dimensional scanning of these patterns with an electron beam are shown beneath the sectional views respectively. The signal yield of the silicon nitride does not appreciably differ from that of the resist. Consequently, these two signal waveforms are substantially the same in that peaks appear only at the edges of each of the patterns, and mere comparison of these signal waveforms cannot discriminate between the line pattern and the space pattern. Therefore, for the purpose of discrimination, it is necessary to correlate these signal waveforms with the profiles of the measured patterns. In the measurement of the width of a pattern, measurement of the width at the base of the pattern is generally required. As will be seen in the waveforms shown in FIGS. 1A and 1B, the positions of the peaks of the waveform appearing at the edges of the space pattern do not coincide with the corresponding positions of the peaks of the waveform appearing at the edges of the line pattern. Therefore, in order to attain accurate measurement of the pattern width, it is indispensable to process the pattern detection signal in relation to the surface profile of the pattern subjected to the measurement.

Known publications relating to a system of this kind include, for example, JP-A- No. 59-112217.

SUMMARY OF THE INVENTION

It is an object of the present invention to provide an electron beam metrology system which can measure the width of a pattern by judging surface topography of the pattern on the basis of a pattern detection signal while reliably discriminating as to whether the pattern is a line pattern or a space pattern.

In accordance with the present invention which attains the above object, there is provided an electron beam metrology system for measuring the width of a pattern on a specimen by scanning the specimen with a deflected electron beam, detecting a pattern image signal provided by secondary electrons or the like emitted from the specimen, and measuring the pattern width on the specimen on the basis of the pattern detection signal, the system comprising signal detecting means including at least one set of two detectors disposed toward the scanning direction of the electron beam in a relation symmetrical with respect to the optical axis of the electron beam for detecting pattern image signals independently of each other, means for recognizing surface topography of the pattern using an output signal of the signal detecting means, and means for measuring the pattern width while discriminating as to whether the pattern is a raised-profile pattern or a hollow-profile pattern.

BRIEF DESCRIPTION OF THE DRAWINGS

FIG. 2 is a block diagram showing the general structure of an embodiment of the electron beam metrology system according to the present invention.

FIGS. 3A to 3H illustrate the operation of the embodiment shown in FIG. 2, in which FIG. 3A is a sectional view of a pattern, and FIGS. 3B to 3H show signal waveforms appearing at various parts of FIG. 2.

FIG. 4 is a block diagram showing the structure of another form of the pattern-edge inclined-direction judging section shown in FIG. 2.

FIGS. 5A to 5F illustrate the operation of the section shown in FIG. 4, in which FIG. 5A is a sectional view of a pattern, and FIGS. 5B to 5F show signal waveforms appearing at various parts of FIG. 4.

FIG. 6 is a block diagram showing the structure of another form of the signal processing section shown in FIG. 2.

FIGS. 7A to 7E illustrate the operation of the section shown in FIG. 6, in which FIG. 7A shows an example of a display on the display unit, and FIGS. 7B to 7E show signal waveforms appearing at various parts of FIG. 6.

DESCRIPTION OF THE PREFERRED EMBODIMENTS

Figure 1A:
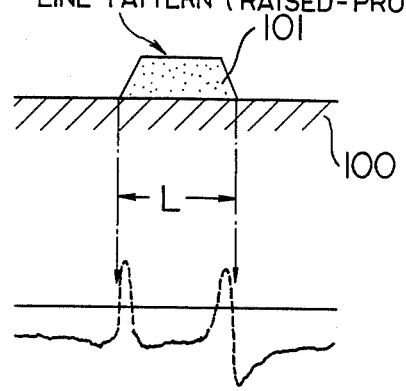
FIG. 1A is a sectional view of a line pattern and shows also the waveform of an image signal of the line pattern.

Preferred embodiments of the present invention will now be described in detail with reference to the drawings.

FIG. 2 is a block diagram showing the general structure of an embodiment of the electron beam metrology system according to the present invention, and FIGS. 3A to 3H illustrate the operation of the system shown in FIG. 2.

Referring to FIG. 2, the embodiment of the present invention comprises an electron microscope column 1, signal amplifiers 6a, 6b, a display unit 8, a deflection signal generator 9, a deflection signal amplifier 10, a control section 11, a pattern-edge inclined-direction judging section 19, and a signal processing section 24. In the electron microscope column 1, a finely focused electron beam 2 is deflected by a deflection coil 3 for scanning a specimen 4 in a one-dimensional or two-dimensional mode. A pattern image signal provided by secondary electrons or the like emitted from the specimen 4 is detected by one set of two signal detectors 5a and 5b disposed toward the scanning direction of the electron beam 2 in a relation symmetrical with respect to the optical axis of the electron beam 2, and the pattern detection output signals of the signal detectors 5a and 5b are amplified by the signal amplifiers 6a and 6b respectively. For the sake of simplicity, a detector arrangement dealing with one-dimensional scanning is merely shown in FIG. 2. However, another set of signal detectors (not shown) are also disposed in a direction orthogonal with respect to the disposed direction of the signal detectors 5a and 5b, so that pattern width measurement in two directions orthogonal to each other can be made. The signals amplified by the signal amplifiers 6a and 6b are applied through a summing amplifier 7 to the display unit 8 as a brightness modulation signal. The deflection signal generator 9 generates a deflection signal under control of the control section 11, and the deflection signal is applied through the deflection signal amplifier 10 to the deflection coil 3 to control deflection of the scanning electron beam 2. The deflection signal from the deflection signal generator 9 is also applied to the display unit 8 in synchronism with the beam scanning under control of the control section 11, and a scanned specimen image is displayed on the display unit 8. The elements described above constitute the fundamental structure of a scanning electron microscope.

A method of pattern width measurement by the embodiment of the electron beam metrology system according to the present invention will now be described with reference to the case where the specimen 4 has a line-and-space pattern having a surface profile as shown in FIG. 3A. FIGS. 3B and 3C show waveforms of image signals which are detected by the signal detectors 5a and 5b with the scanning of the pattern by the electron beam 2 and are then amplified by the signal amplifiers 6a and 6b respectively. It is supposed herein that the direction of scanning with the electron beam 2 is from the signal detector 5a toward the signal detector 5b. In a prior art system, a sum signal as shown in FIG. 3D, that is, the output signal of the summing amplifier 7 which sums the pattern detection output signals of the signal detectors 5a and 5b, was used for measurement of the pattern width. Alternatively, a similar signal appearing at the output of a single signal detector disposed in parallel to a pattern was used for pattern width measurement. However, as described already, surface topography information cannot be provided by such a signal, and it is impossible with such a signal to discriminate between a line pattern and a space pattern. In contrast, according to the signal detector arrangement shown in FIG. 2, the signal detectors 5a and 5b are disposed toward the deflected beam scanning direction in a relation symmetrical with respect to the optical axis of the electron beam 2. Therefore, in relation to the surface topography of the pattern, the magnitude of the pattern detection output signal of the signal detector confronting an edge of the pattern is large, but that of the pattern detection output signal of the signal detector not confronting the edge is small. The system including the signal detector 5a and the signal amplifier 6a, and the system including the signal detector 5b and the signal amplifier 6b are previously adjusted so that their detection output signals show the same level and gain at a flat portion of a specimen.

The signal amplifiers 6a and 6b are also connected to a pattern-edge inclined-direction judging section 19 which is an important component of the system of the present invention. This section 19 includes a differential amplifier 12, a comparator 13 and a level adjuster 14. In operation, the output signals of the signal amplifiers 6a and 6b are applied to the differential amplifier 12, and a difference signal as shown by the solid-line waveform in FIG. 3E (a signal obtained by subtracting the signal shown in FIG. 3C from the signal shown in FIG. 3B) appears from the differential amplifier 12. The positive-sign portions of this difference signal indicate that the two edges of the pattern incline toward the signal detector 5a, and the negative-sign portions indicate that the other two edges of the pattern incline toward the signal detector 5b. This difference signal is normalized into a positive and negative pulse signal as shown in FIG. 3F by the comparator 13 having two comparison levels $l_1$ and $l_2$ shown by the broken lines in FIG. 3E. These comparison levels $l_1$ and $l_2$ are set by the level adjuster 14. When these comparison levels $l_1$ and $l_2$ are suitably adjusted by the level adjuster 14, the start positions or end positions of the positive and negative pulses of the signal shown in FIG. 3F can be made to correspond to a specific part of the pattern edges. Thus, when the base of the pattern is noted, and the comparison levels $l_1$ and $l_2$ are so selected, each of the positive pulses rises (leads) or starts (output:0→1) at the position of the base of one of the edges, and each of the negative pulses falls (trails) or ends (output: −1→0) at the position of the base of that edge. The output signal (shown in FIG. 3F) of the comparator 13 is applied to a line-width measuring gate circuit 16L and a space-width measuring gate circuit 16S to control on-off of these gate circuits. That is, the line pattern width and the space pattern width are separately measured. Measurement of the line pattern width will be described by way of example. Since the direction of scanning with the electron beam 2 is from the signal detector 5a toward the signal detector 5b, the pattern edge inclining toward the signal detector 5a is first scanned by the electron beam 2, and the pattern edge inclining toward the signal detector 5b is then scanned. The gate circuit 16L is opened at the start position (output:0→1) of the positive pulse, and clock pulses from a clock pulse oscillator 15 are counted by a counter 17L. The gate circuit 16L is closed at the end position (output: −1→0) of the negative pulse, and the counter 17L ceases its counting operation (FIG. 3G). The address of the clock pulse corresponds to the address of the deflected electron beam, that is, the position of the electron beam on the pattern being measured. After the count of the counter 17L is written in a memory 18L, the counter 17L is reset to zero. On the other hand, the gate circuit 16S participates in the measurement of the space pattern width. This gate circuit 16S is opened at the end position (output: −1→0) of the negative pulse in the output signal (FIG. 3F) of the comparator 13, and the pulses from the clock pulse oscillator 15 are counted by a counter 17S. The gate circuit 16S is closed at the start position (output:0→1) of the next positive pulse, and the counter 17S ceases its counting operation (FIG. 3H). After the count of the counter 17S is written in a memory 18S, the counter 17S is reset to zero. The counts supplied to the control section 11 from the memories 18L and 18S are computed in the control section 11 on the basis of the factors including the deflection sensitivity of the primary electron beam and are converted into the values representing the line pattern width and the space pattern width respectively. In the embodiment shown in FIG. 2, the pattern width is measured in the manner described above.

Another embodiment of the present invention will be described with reference to FIGS. 4 and 5. In this embodiment, the internal structure of the pattern-edge inclined-direction judging section 19 in FIG. 2 is modified as shown in FIG. 4, and the remaining parts are fundamentally the same as those shown in FIG. 2. The manner of pattern width measurement according to this embodiment is such that portions having a maximum inclination in a difference signal (shown by the solid-line waveform in FIG. 5B) generated from the differential amplifier 12 correspond to pattern edges shown in FIG. 5A. The steps of pattern width measurement in this embodiment will now be described. The difference signal from the differential amplifier 12 is applied to the comparator 13 with which the level adjuster 14 is associated to determine comparison levels $m_1$ and $m_2$ (shown by the broken lines in FIG. 5B). Thus, the comparator 13 generates a normalized positive and negative pulse signal in which positive and negative pulses correspond to the inclined directions of the pattern edges as shown in FIG. 5C. The difference signal from the differential amplifier 12 is applied also to a differentiating circuit 20 and is differentiated to appear as an output signal having a waveform as shown in FIG. 5D. The output signal from the differentiating circuit 20 is applied to a peak position detecting circuit 21 with which another level adjuster 22 is associated to determine a level setting n. The peak position detecting circuit 21 detects the position addresses of the maximum peaks of the input signal waveform exceeding the level setting n determined by the level adjuster 22 and generates a pulse signal as shown in FIG. 5E. The pulse signal shown in FIG. 5E is multiplied by the pulse signal shown in FIG. 5C by a multiplier 23, and a positive and negative pulse signal indicative of the inclined directions of the pattern edges as shown in FIG. 5F appears from the multiplier 23. The gate circuit 16L is opened by being triggered by each of the positive pulses shown in FIG. 5F and is closed by being triggered by each of the negative pulses shown in FIG. 5F. The function of the gate circuit 16S is inverse to that of the gate circuit 16L. In the manner described above, the line and space patterns are discriminated from each other, and the maximum inclination portions of the waveform of the difference signal represent the pattern edges, so that the pattern width of each of the patterns can be accurately measured.

The aforementioned embodiments have referred to the measurement of the pattern width by determining the inclined directions of pattern edges on the basis of the difference signal representing the difference between the output signals of the signal detectors. However, the inclined directions of pattern edges may be determined on the basis of the difference signal of the detector output signals, and the sum signal of the detector output signals may be used for the measurement of the pattern width. Such a modification is also included in the scope of the present invention. Also, a division signal of the detector output signals may be used for determining the inclined directions of pattern edges.

Still another embodiment of the present invention will be described with reference to FIGS. 6 and 7. In this embodiment, the internal structure of the signal processing section 24 is modified as shown in FIG. 6, and two cursors 31 as shown in FIG. 7A are displayed on the display unit 8. Referring to FIG. 6 showing the structure of the signal processing section in this embodiment, pattern detection signals $X^-$ and $X^+$ from the two signal detectors 5a and 5b respectively are applied to an adder circuit 25 to appear as a sum signal $(X^- + X^+)$. The signals $X^-$, $X^+$ and $(X^- + X^+)$ are applied to summing-averaging circuits 26A, 26B and 26C respectively to be summed and averaged according to the number of times of deflection scanning (1 to 1024) determined by the control section 11. The output signals of summing-averaging circuits 26A to 26C are A/D converted into digital signals of $12 \times 12$ bits by analog/digital converting circuits 27A to 27C respectively, and the digital signals are stored in $12 \times 12$-bits memories 28A to 28C respectively. The sum signal stored in the memory 28C is differentiated by a differentiating circuit 29, and the output signal of the differentiating circuit 29 is displayed on the waveform display unit 8 and, at the same time, A/D converted by an A/D converting circuit 27D into a digital signal to be stored in a memory 28D.

The procedure for judging surface topography of a pattern to be measured thereby measuring the width of the pattern will now be described.

Figure 1B:
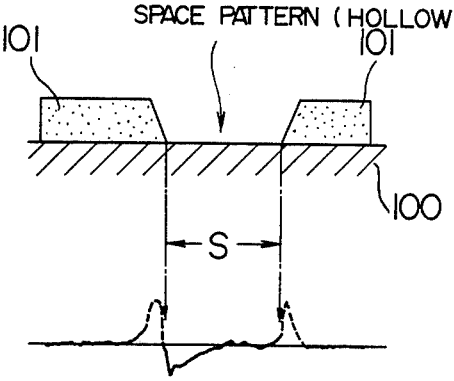
FIG. 1B is a sectional view of a space pattern and shows also the waveform of an image signal of the space pattern.

When a pattern as shown in FIG. 1A or 1B is scanned with the electron beam 2, a sum signal waveform 30 as shown in FIG. 7A is displayed on the waveform display unit 8. FIGS. 7B and 7C show the waveforms of the signals $X^-$ and $X^+$ respectively. The positions of two cursors 31 displayed in superposition to the sum signal waveform 30 are adjusted to determine the signal waveform processing range, and the control section 11 reads the addresses $x_l$ and $x_r$ of the positions of the respective cursors 31. Then, the control section 11 finds addresses $x_1'$ and $x_2'$ corresponding to the maximum values or levels of the respective signals $X^-$ and $X^+$ in the signal waveform processing range defined between $X_l$ and $X_r$. The control section 11 compares the relative magnitudes of the values of the addresses $x_1'$, and $x_2'$ and decides that the pattern is a line pattern when $x_2' > x_1'$, but decides that the pattern is a space pattern when $x_1' > x_2'$. When the pattern is identified as a line pattern, the control section 11 will find addresses $x_1$ and $x_2$ corresponding to the maximum and minimum values respectively of the differentiated signal waveform in the ranges of x outside the addresses $x_1'$ and $x_2'$, that is, in the ranges $x_l \leq x \leq x_1'$ and $x_2' \leq x \leq x_r$, as shown in FIG. 7D. On the other hand, when the pattern is identified as a space pattern, the control section 11 will find addresses $x_1$ and $x_2$ corresponding to the maximum and minimum values respectively of the differentiated signal waveform in the range of x inside the addresses $x_1'$ and $x_2'$, that is, in the range $x_1' \leq x \leq x_2'$, as shown in FIG. 7E. Thus, the width l at the base of the pattern is calculated as $l = |x_1 - x_2|$.

It will be understood from the foregoing detailed description that the present invention provides an electron beam metrology system which can measure the width of a pattern by judging the surface topography of the pattern on the basis of a pattern detection signal and reliably discriminating as to whether the pattern is a line pattern or a space pattern.

We claim:

1. An electron beam metrology system for measuring the width of a pattern on a specimen by scanning the specimen with a deflected electron beam, detecting a pattern image signal provided by secondary radiation emitted from the specimen, and measuring the pattern width on the specimen on the basis of the pattern detection signal, said system comprising signal detecting means including at least one set of two detectors disposed toward the scanning direction of the electron beam in a relation symmetrical with respect to the optical axis of the electron beam for detecting pattern image signals independently of each other, means for recognizing surface topography of the pattern using an output signal of said signal detecting means, and means for measuring the pattern width while discriminating as to whether the pattern is a raised-profile pattern of a hollow-profile pattern, said means for recognizing the surface topography of the pattern including means for generating a difference signal representing the difference between the two pattern image signals detected independently by said signal detectors in the course of scanning with the electron beam so as to enable identification of the inclined directions of edges of the pattern, and said pattern width measuring means including means for converting said difference signal into a normalized pulse signal including a positive pulse and a negative pulse indicative of the inclined directions of the edges of the pattern, means for differentiating said difference signal to generate a signal bearing the information of peak positions of said difference signal, and means for multiplying said peak position information signal by said normalized pulse signal so as to discriminate whether the pattern is a raised-profile pattern or a hollow-profile pattern.

2. An electron beam metrology system for measuring the width of a pattern on a specimen by scanning the specimen with a deflected electron beam, detecting a pattern image signal provided by secondary radiation emitted form the specimen, and measuring the pattern width on the specimen on the basis of the pattern detection signal, said system comprising signal detecting means including at least one set of two detectors disposed toward the scanning direction of the electron beam in a relation symmetrical with respect to the optical axis of the electron beam for detecting pattern image signals independently of each other, means for recognizing surface topography of the pattern using an output signal of said signal detecting means, and means for measuring the pattern width while discriminating as to whether the pattern is a raised-profile pattern of a hollow-profile pattern, said means for recognizing the surface topography of the pattern including means for finding position coordinates corresponding to the maximum values of the two pattern image signals detected independently by said detectors respectively, and means for judging the relative magnitudes of these two position coordinates such that the surface topography of the pattern is recognized on the basis of the relation between the scanning direction of the electron beam relative to said two detectors and information indicative of the result of judgement of the relative magnitudes of said position coordinates.

* * * * *